(12) United States Patent
Shook

(10) Patent No.: US 12,294,374 B2
(45) Date of Patent: May 6, 2025

(54) PULSE WIDTH DISTORTION CORRECTION

(71) Applicant: TEXAS INSTRUMENTS INCORPORATED, Dallas, TX (US)

(72) Inventor: Adam Shook, Carollton, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/678,075

(22) Filed: May 30, 2024

(65) Prior Publication Data

US 2024/0322804 A1 Sep. 26, 2024

Related U.S. Application Data

(63) Continuation of application No. 18/153,383, filed on Jan. 12, 2023, now Pat. No. 12,028,074.

(60) Provisional application No. 63/343,603, filed on May 19, 2022.

(51) Int. Cl.
*H03K 5/08* (2006.01)
(52) U.S. Cl.
CPC ..................................... *H03K 5/08* (2013.01)
(58) Field of Classification Search
None
See application file for complete search history.

(56) References Cited

U.S. PATENT DOCUMENTS

| | | | |
|---|---|---|---|
| 6,897,703 B2* | 5/2005 | Hunt | H03K 5/08 327/327 |
| 7,049,859 B2 | 5/2006 | Boyer | |
| 7,167,382 B2 | 1/2007 | Hachiya | |
| 7,496,781 B2 | 2/2009 | Tamura | |
| 2015/0168484 A1 | 6/2015 | Rätz | |
| 2018/0145668 A1* | 5/2018 | Chan | H03K 17/08122 |

* cited by examiner

*Primary Examiner* — Cassandra F Cox
(74) *Attorney, Agent, or Firm* — Charles F. Koch; Frank D. Cimino

(57) ABSTRACT

An integrated circuit (IC) includes a signal detection circuit having a signal detection circuit input and a signal detection circuit output. The IC further includes a reference voltage circuit having a reference voltage circuit input and a reference voltage circuit output. The IC also includes a comparator having a first comparator input and a second comparator input. The first comparator input is coupled to the reference voltage circuit output, and the second comparator input is coupled to the signal detection circuit output. The IC includes a clamp circuit having a clamp circuit input and a clamp circuit output. The clamp circuit input is coupled to the signal detection circuit, and the clamp circuit output is coupled to the reference voltage circuit output.

20 Claims, 9 Drawing Sheets

PULSE WIDTH DISTORTION CORRECTION

CROSS-REFERENCE TO RELATED APPLICATIONS

This application is a continuation of U.S. application Ser. No. 18/153,383, filed Jan. 12, 2023, which claims priority to U.S. Provisional Application No. 63/343,603, filed May 19, 2022, titled "Pulse Width Distortion Correction in ISO Lane Envelope Detector Using an Active Clamp," which is hereby incorporated by reference.

BACKGROUND

Many electronic systems include circuitry that produces one or more electrical pulses (e.g., voltage pulses). The width of each voltage pulse is carefully timed to control an aspect of the electronic system. For example, a switching direct current (DC)-to-DC voltage regulator may generate a pulse width modulation (PWM) control signal to be used to regulate the magnitude of the regulator's output voltage. By way of an additional example, a traction inverter for an electric vehicle (EV) may control the voltage to the EVs motor using a series of electrical pulses of a prescribed pulse width.

SUMMARY

In at least one example, an integrated circuit (IC) includes a signal detection circuit having a signal detection circuit input and a signal detection circuit output. The IC further includes a reference voltage circuit having a reference voltage circuit input and a reference voltage circuit output. The IC also includes a comparator having a first comparator input and a second comparator input. The first comparator input is coupled to the reference voltage circuit output, and the second comparator input is coupled to the signal detection circuit output. The IC includes a clamp circuit having a clamp circuit input and a clamp circuit output. The clamp circuit input is coupled to the signal detection circuit, and the clamp circuit output is coupled to the reference voltage circuit output.

DETAILED DESCRIPTION

Figure 1:
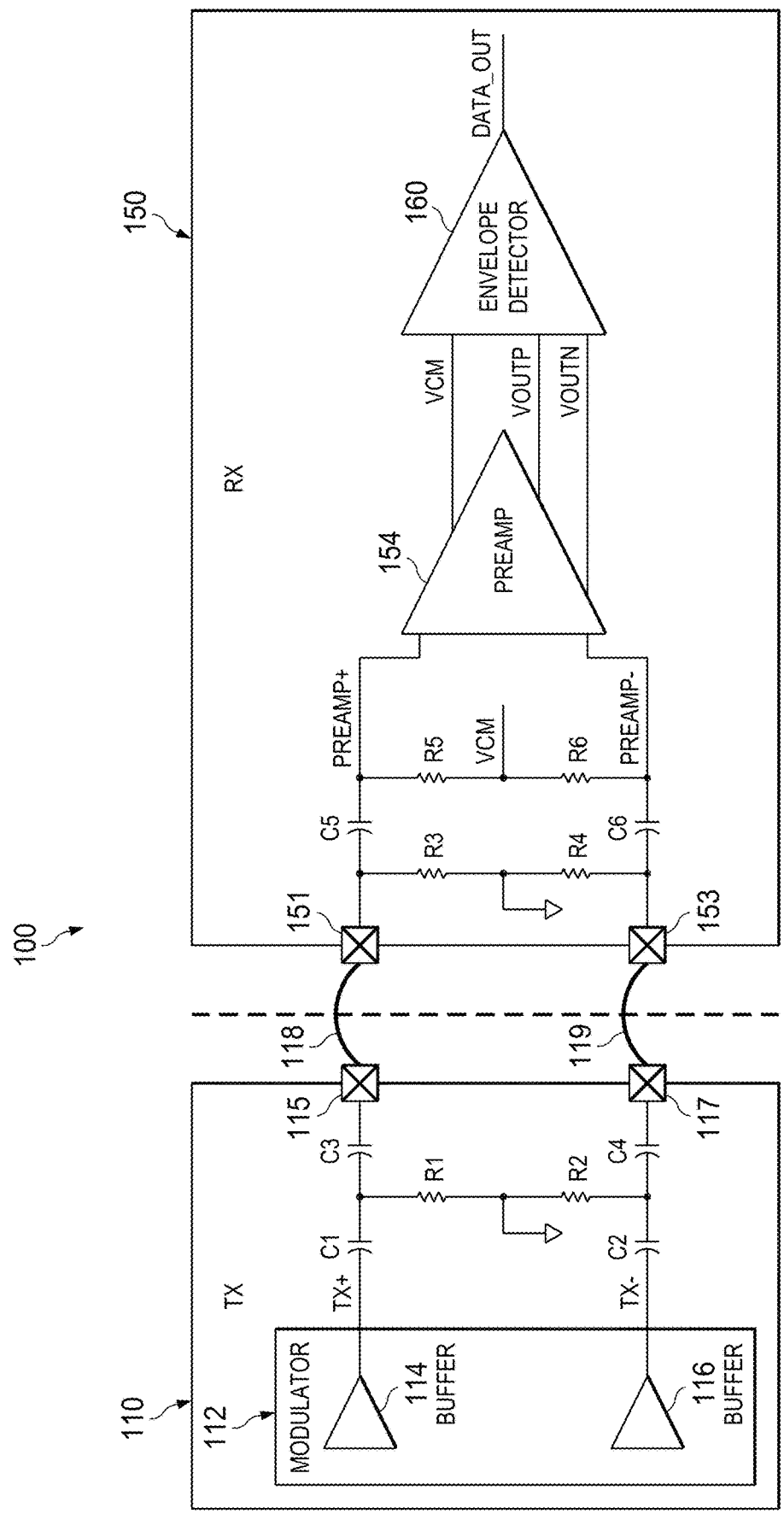
FIG. 1 is a schematic diagram of a system employing on-off keying (OOK) for data communication using an envelope detector to recover the modulated signals, in an embodiment.

The same reference numbers or other reference designators are used in the drawings to designate the same or similar (either by function and/or structure) features.

FIG. 1 is a schematic diagram of a system 100 in which electrical pulses are generated. System 100 includes a transmitter 110 and a receiver 150. In this example, the system 100 is fabricated as a semiconductor device (e.g., an integrated circuit (IC)) and receiver 150 is fabricated as a separate semiconductor device (e.g., IC). The two ICs are coupled by way of a bond wires 118 between pins 115 and 151 and a second bond wire 119 between pins 117 and 153. The transmitter 110 and receiver 150 may be part of, for example, a traction inverter of an EV, a voltage regulator, etc.

Transmitter 110 includes a modulator 112, capacitors C1-C4, and resistors R1 and R2. The transmitter 110 transmits a differential signal TX+ and TX− by way of buffers 114 and 116 to the receiver 150. Capacitor C1 is coupled to resistor R1, and the combination of capacitor C1 and resistor R1 forms a high-pass filter for signal TX+. Similarly, capacitor C2 is coupled to resistor R2, and the combination of capacitor C2 and resistor R2 forms a high-pass filter for signal TX−. Capacitors C3 and C4 are isolation capacitors and, in an example in which transmitter 110 has a substantially different supply voltage than receiver 150, are high voltage isolation capacitors.

Receiver 150 includes resistors R3-R6, capacitors C5 and C6, a preamplifier 154, and an envelope detector 160. Resistors R3 and R4 are termination resistors. The combination of capacitor C5 and resistor R5 is a high-pass filter, and similarly, the combination of capacitor C6 and resistor R5 also is a high-pass filter to provide filtered signals PREAMP+ and PREAMP− to inputs of the preamplifier 154.

The preamplifier 154 amplifies the differential input signal, which is PREAMP+ and PREAMP−, and provides an amplified differential signal VOUTP−VOUTN to the input of the envelope detector 160. The differential signal (VOUTP−VOUTN) has a common mode voltage, VCM, that also is provided by the preamplifier 154 to the envelope detector 160. The output signal from the envelope detector 160 is DATA_OUT.

The transmitter 110 transmits serial bits to the receiver 150 through implementation, in this example, of on-off keying (OOK) modulation. In OOK modulation, the presence of a carrier for a specific duration represents a binary "1", while its absence for the same duration represents a binary '0.' The transmitter 110 modulates a carrier (e.g., a square wave, sine wave, triangle wave, etc.) according to OOK modulation, and the envelope detector 160 demodulates the signal to recover the original bit as DATA_OUT.

Figure 2:
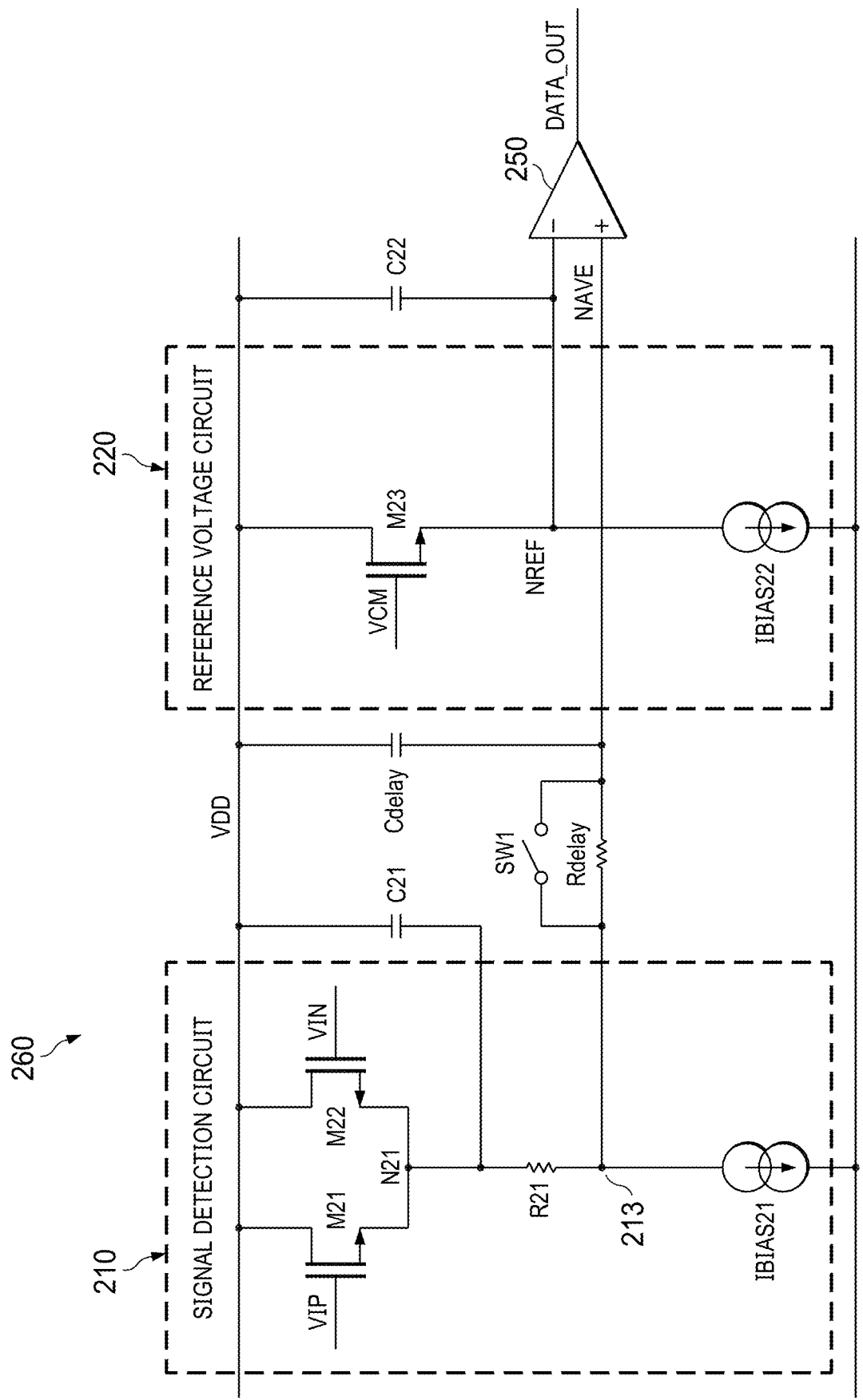
FIG. 2 is a schematic diagram of an example implementation of the envelope detector of FIG. 1.

FIG. 2 is a schematic of an envelope detector 260, which may be used to implement envelope detector 160 in FIG. 1. Envelope detector 260 includes a signal detection circuit 210, a reference voltage circuit 220, and a comparator 250. The signal detection circuit 210 includes transistors M21 and M22, a resistor R21, a capacitor C21, and a current source circuit IBIAS21. Current source circuit IBIAS21 ('IBIAS21' refers to both the current source circuit and the magnitude of the current it produces) is coupled between resistor R21 and ground. In this example, transistors M21 and M22 are n-channel field effect transistors (NFETs). The drains of transistors M21 and M22 are coupled together and to the supply voltage VDD. The gates of transistor M21 and M22 provide a differential input for the envelope detector. Input signals VIP and VIN are the preamplifier's output signals VOUTP and VOUTN, respectively. The sources of transistors M21 and M22 are coupled together at node N21. Resistor R21 is coupled between node N21 and the current source circuit IBIAS21. Capacitor C21 is coupled between VDD and node N21. The signal detection circuit 210 has an output 213 that is the connection between resistor R21 and the current source circuit IBIAS21.

The reference voltage circuit 220 includes a transistor M23 (an NFET in this example) coupled to a current source circuit IBIAS22. The input to the reference voltage circuit 220 is the gate of transistor M23 and receives the common mode voltage VCM from the preamplifier 154. The output of the reference voltage circuit 220 is the source of transistor M23. The output signal from the reference voltage circuit is a reference signal labeled NREF. The comparator 250 has a negative (−) input, a positive (+) input, and an output. The negative input of the comparator 250 receives the reference signal NREF. The positive input of the comparator is coupled through a resistor, Rdelay, to the output 213 of the signal detection circuit 210. A switch SW1 is coupled in parallel with resistor Rdelay. Capacitor Cdelay is coupled between VDD and the positive input of the comparator 250. The comparator's output provides the envelope detector's output signal, DATA_OUT.

During transmission of a logic '0' for OOK modulation, the differential signals VIP and VIN are approximately at the common mode voltage VCM. With both input signals VIP and VIN at the same common mode voltage level, the voltage on node N21 is at a particular voltage level that is lower than the voltage at node N21 when a logic '1' is being transmitted. The voltage drop across resistor R21 is the current IBIAS21 times the resistance of resistor R21 (IBIAS×R21). The voltage on the output 213 is thus the node N21 voltage minus (IBIAS×R21). Through resistor Rdelay, the voltage on the signal detection circuit's output 213 (signal NAVE) is coupled to the positive input of the comparator 250. The magnitude of the bias current circuit IBIAS21 and the resistance of resistor R21 determine the voltage of NAVE relative to the voltage at node N21. The bias current IBIAS21 and the resistor R21 are selected such that NAVE is smaller than NREF when VIP and VIN are both approximately equal to VCM during transmission of a '0' With NREF being larger than NAVE, DATA_OUT will be a logic '0'.

During transmission of a logic '1' for OOK modulation, the differential signals VIP and VIN change magnitude in opposite directions. For example, both VIP and VIN may be square waves during transmission of a logic '1' with VIP being a higher voltage than VIN during part of each cycle and then VIN being a higher voltage than VIP during the other part of each cycle. The common mode voltage of this switching waveform is VCM. In other examples, VIP and VIN may be sinewaves, triangle waves, etc.

During each switching cycle of a logic "1" data bit, one of VIP or VIN is higher than the other of VIP and VIN. The input swing at VIP and VIN should be greater than the voltage (R21*IBIAS21) so that the voltage swing on N21 will be larger than the voltage drop across R21. The voltage on node N21 is approximately equal to the threshold voltage of transistors M21 and M22 below the higher voltage of VIP or VIN. The voltage on node N21 in this state will be larger than NREF. With NAVE being larger than NREF, DATA_OUT will be a logic '1.'

The combination of resistor Rdelay and capacitor Cdelay adds a time delay. The rate of change of the voltage with respect to time on node N21 when transitioning from high to low is set by Ibias21 and C21 per the equation I/C=dv/dt. However, the dv/dt of node N21 when transitioning from low to high is a function on the input signals VIP or VIN and the transconductance (gm) of transistors M21 and M22. Capacitor C21 will charge toward VDD as a function of the transconductance of M21 times the overdrive voltage applied to transistor M21. The voltage (VIP) applied to the gate of transistor M21 and the gm of transistor M21 can be quite high such that the positive charging current for capacitor C21 during a low to high transition can cause the dV/dt to be much high than the current provided by IBAIS21 to discharge capacitor C21 during the high to low transition. This make the average dV/dt of node N21 higher for a low to high transition than for the high to low transition. The RC time delay implemented by the combination of resistor Rdelay and capacitor Cdelay is used to balance the average time for a low to high transition at DATA_OUT with the high to low transition. The switch SW1 across Rdelay is used so that the RC time delay only effects the low to high transition and not the high to low transition. This use of the RC time delay effects only the systematic difference between the low to high and high to low transition from the imbalance of current that can be provided from the source follower transistor M21 and the fixed bias current IBIAS21. This help to balance dV/dt of the NAVE and nominally makes the low to high and the high to low transitions approximately equal.

Figure 3:
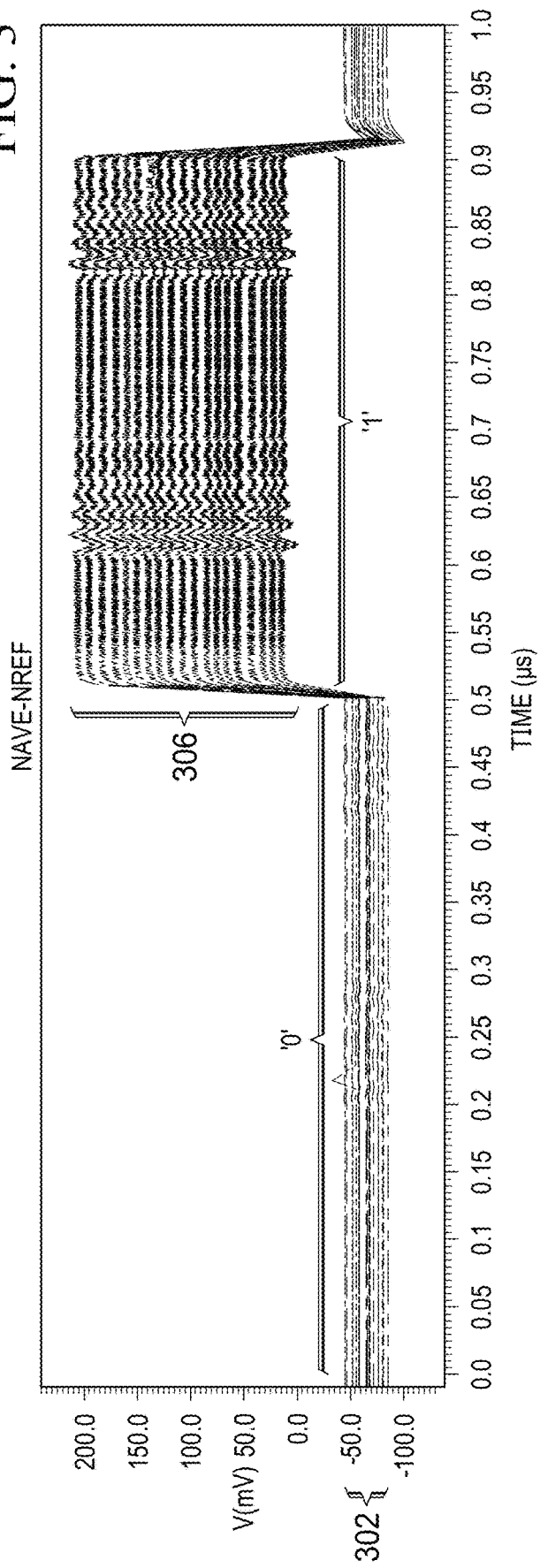
FIGS. 3 and 4 are waveforms illustrating the operation of the envelope detector of FIG. 2.
Figure 4:
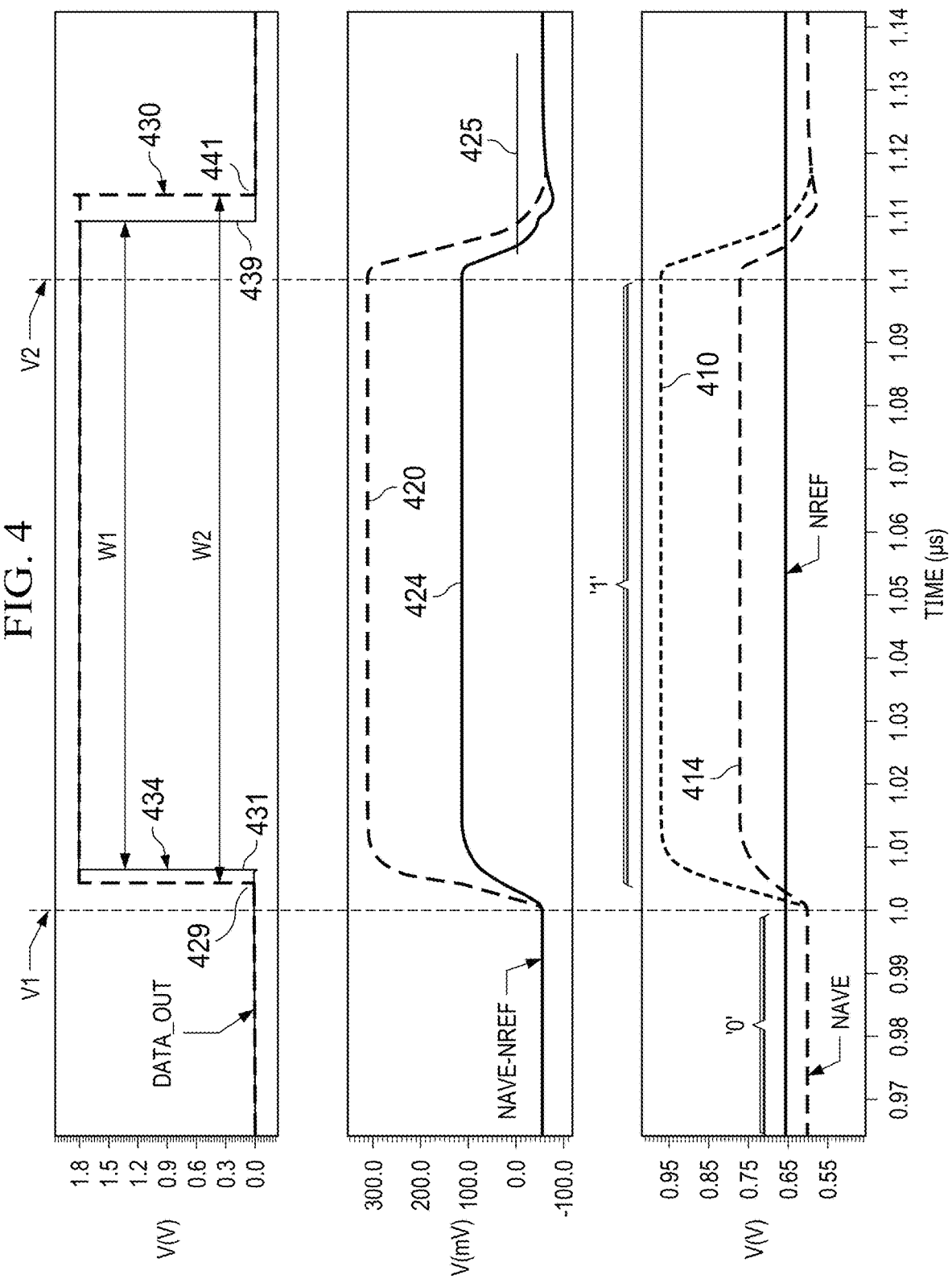

FIGS. 3 and 4 are waveforms that explain a problem with the envelope detector 260 of FIG. 2. FIG. 3 shows a series of waveforms of the voltage difference between NAVE and NREF (NAVE-NREF). The waveforms represent simulations across process corners of the receiver containing the envelope detector 260. As explained above, NAVE is smaller than NREF for a logic '0.' Accordingly, (NAVE-NREF) is a negative voltage value which, in this example, ranges as indicated by reference numeral 302 between approximately −45 mV and −85 mV. The range 302 for (NAVE-NREF) is generally controlled by using, for example, a current source circuit IBIAS21 that is implemented such that process variations affect the current source circuit IBIAS21 the same as resistor R21, and by reducing threshold voltage mismatch between transistors M21-M23.

For a logic '1' the variation 306 of (NAVE-NREF) is substantially greater ranging in this example from approximately 5 mV to 205 mV. Variation 306 is generally governed by changes in process and temperature, which have a larger impact on the variation of (NAVE−NREF) for a logic '1' than the bandgap accuracy and device mismatch effect (NAVE−NREF) for a logic '0.'

FIG. 4 shows example waveforms for NREF and NAVE at the bottom of the figure, (NAVE-NREF) in the middle of the figure, and DATA_OUT at the top of the figure. In this example, NREF is approximately 0.65 V (650 mV). Two waveforms 410 and 414 for NAVE are shown. NAVE waveforms 410 and 414 represent the values of NAVE at opposing process and temperature corners. For a logic '0,' NAVE does not vary much, but varies to a large extent for a logic '1' (approximately 0.76 V for NAVE waveform 414 up to approximately 0.96 V for NAVE waveform 410). Waveforms 420 and 424 represent (NAVE−NREF) and thus reflect the difference in NAVE waveforms 410 and 414 for a logic '1.' Waveform 424 jumps up to a value of approximately 100 mV for a logic '1' while waveform 420 increases further to approximately 300 mV. Voltage 425 represents the offset voltage of the comparator 250 below which the falling edge of (NAVE-NREF) must fall to cause the comparator's output signal DATA_OUT to transition from a logic 1 to a logic 0.

Two waveforms 430 and 434 are shown for DATA_OUT. Waveforms 420 and 430 correspond to the same process corner, which results in the comparator 250 causing its output to transition from a logic '0' to a logic '1' at edge 429 and its output logic '1' to fall back to a logic '0' at edge 441. Waveforms 424 and 434 correspond to a different process corner, which results in the comparator 250 causing its output to transition from a logic '0' to a logic '1' at edge 431 and its output logic '1' to fall back to a logic '0' at edge 439. The variation in the falling edge of DATA_OUT is larger than the variation in the leading edge of DATA_OUT. The variations in the width W1 and W2 of DATA_OUT represents pulse width distortion, which is addressed by the embodiment of an envelope detector 560 shown in FIG. 5 and described below. The larger variation in the falling edge variability is a principal contributor to pulse width distortion. Envelope detector 560 reduces the variation in the falling edge of DATA_OUT across process and temperature variations.

Figure 5:
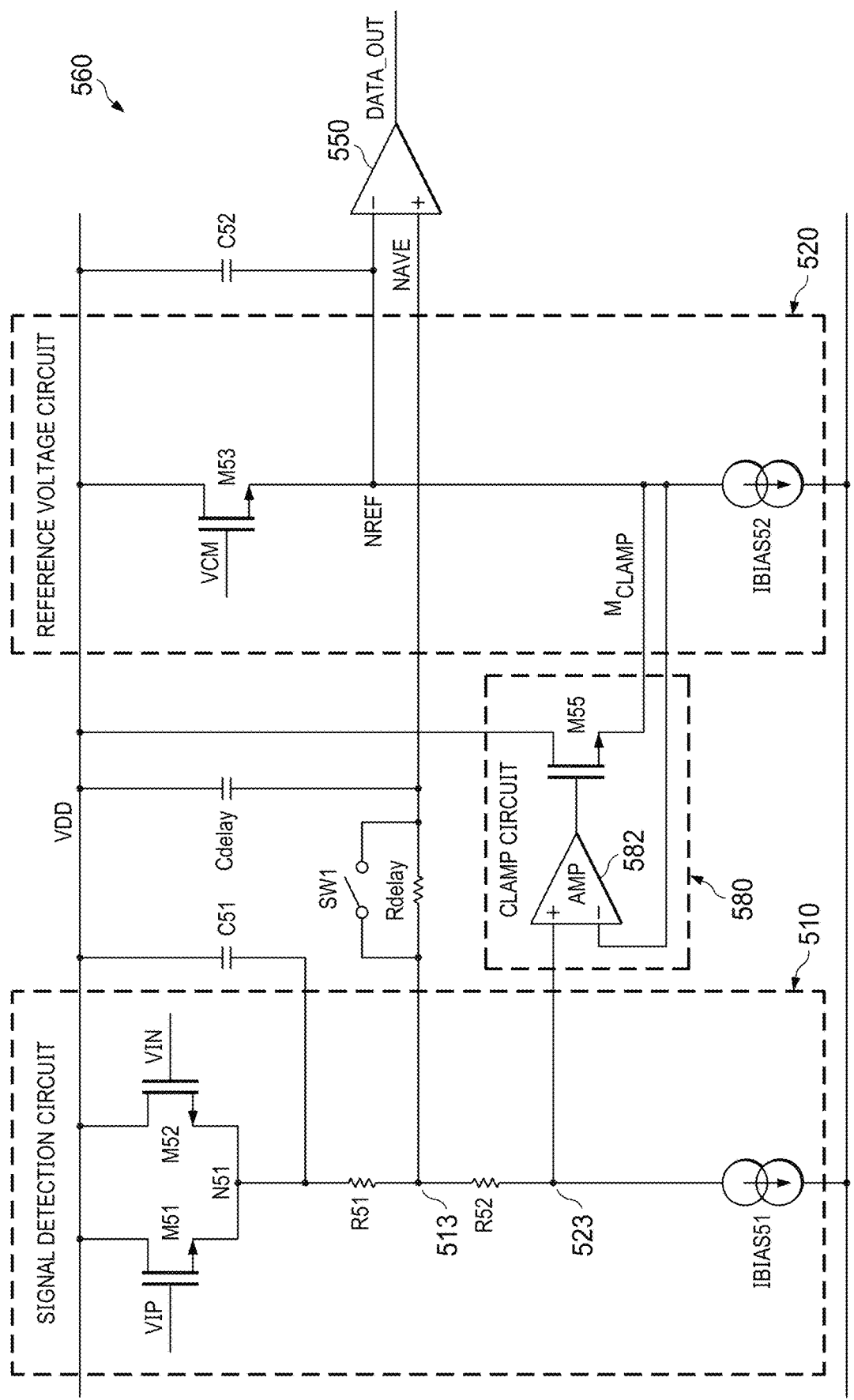
FIG. 5 is a schematic diagram of an envelope detector having a clamp circuit, in another embodiment.

FIG. 5 is a schematic of an envelope detector 560 that addresses the falling edge variability problem described above. The envelope detector 560 in FIG. 5 may be used to implement envelope detector 160 in FIG. 1. Envelope detector 560 includes a signal detection circuit 510, a reference voltage circuit 520, a comparator 550, and a clamp circuit 580. As is described herein, the clamp circuit 580 ensures that (NAVE−NREF) does not become larger than the clamp voltage implemented by the clamp circuit, thereby reducing the variation of (NAVE−NREF) across process and temperature.

The signal detection circuit 510 includes transistors M51 and M52, resistors R51 and R52, a capacitor C51, and a current source circuit IBIAS51. Current source circuit IBIAS51 is coupled between resistor R52 and ground. In this example, transistors M51 and M52 are NFETs. The drains of transistors M51 and M52 are coupled together and to the supply voltage VDD. The gates of transistor M51 and M52 provide a differential input for the envelope detector 560. The sources of transistors M51 and M52 are coupled together at node N51. Resistors R51 and R52 are coupled in series, and the series combination of resistors R51 and R52 is coupled between node N51 and the current source circuit IBIAS51. The connection between resistor R52 and the current source circuit IBIAS51 is labeled 523. Capacitor C51 is coupled between VDD and node N51. The signal detection circuit 510 has an output 513 that is the connection between resistors R51 and R52.

The reference voltage circuit 520 includes a transistor M53 (an NFET in this example) coupled to a current source circuit IBIAS52. The input to the reference voltage circuit 520 is the gate of transistor M53 and receives the common mode voltage VCM from the preamplifier 154. The output of the reference voltage circuit 520 is the source of transistor M53. As was the case for the envelope detector 260 of FIG. 2, the output signal from the reference voltage circuit 520 is a reference signal labeled NREF. The negative input of the comparator 550 receives the reference signal NREF. The positive input of the comparator is coupled through resistor Rdelay to the output 513 of the signal detection circuit 510. Switch SW1 is coupled in parallel with resistor Rdelay. Capacitor Cdelay is coupled between VDD and the positive input of the comparator 550. The comparator's output provides the envelope detector's output signal, DATA_OUT.

The clamp circuit 580 includes an amplifier 582 and a transistor M55. Transistor M55 is an NFET in this example. The amplifier's positive input is coupled to connection 523 within the signal detection circuit 510. The amplifier's negative input is coupled to NREF. The output of amplifier 582 is coupled to the gate of transistor M55. Transistor M55 is coupled between VDD and the output NREF of the reference voltage circuit 520. Current through transistor M55 is labeled I1. The output of the reference voltage circuit 520 is the connection between the source of transistor M53 and the current source circuit IBIAS52, which produces the reference voltage NREF.

Resistor R52 is coupled between the signal detection circuit output 513 and the clamp circuit input (e.g., the positive input of amplifier 582). The current through both resistors R51 and R52 is IBIAS51. Accordingly, the voltage drop across resistor R51 is (IBIAS51×R51), and the voltage drop across resistor R52 is (IBIAS51×R52). The voltages on signal detection circuit output 513 and connection 523 with respect to ground track in the same direction as the voltage node N51—e.g., as the voltage on node N51 increases, the voltages on output 513 and connection 523 also increase, and vice versa.

During the transmission of a logic '0' in which VIP and VIN are both approximately equal to VCM, the voltage on node N51 is low enough that the voltage on output 513 (NAVE) is lower than NREF, and DATA_OUT is a logic '0.' The negative input of amplifier 582 receives the reference voltage NREF. During a logic '0' transmission, the voltage on connection 523 is lower NREF and the amplifier 582 maintains transistor M55 in an OFF state, and thus current I1 is approximately 0 amperes. In this state, NAVE may vary a little based on process and temperature as described above.

However, when NAVE becomes high enough (due to process and/or temperature variations) that the positive input to amplifier 582 exceeds NREF on its negative input, amplifier 582 forces transistor M55 to turn ON thereby activating the clamp circuit 580. Transistor M55 is selected to have a lower on-resistance than transistor M53. Accordingly, transistor M55 is a lower resistance path than transistor M53 for current IBIAS52. A larger portion of current IBIAS52 flows through transistor M55 (as current I1) than through transistor M53. Due to the lower on-resistance of transistor M55 compared to transistor M53, the drain-to-source voltage (Vds) of transistor M55 is smaller than the Vds of transistor M53 when transistor M55 was OFF. As a result of the lower Vds of transistor M55, NREF increases when M55 turns ON. As a result of the clamp circuit 580 forcing NREF to increase as NAVE increases, the voltage difference (NAVE-NREF) is held fairly constant (clamped) once the clamp circuit activates (amplifier 582 turns ON transistor M55).

Figure 6:
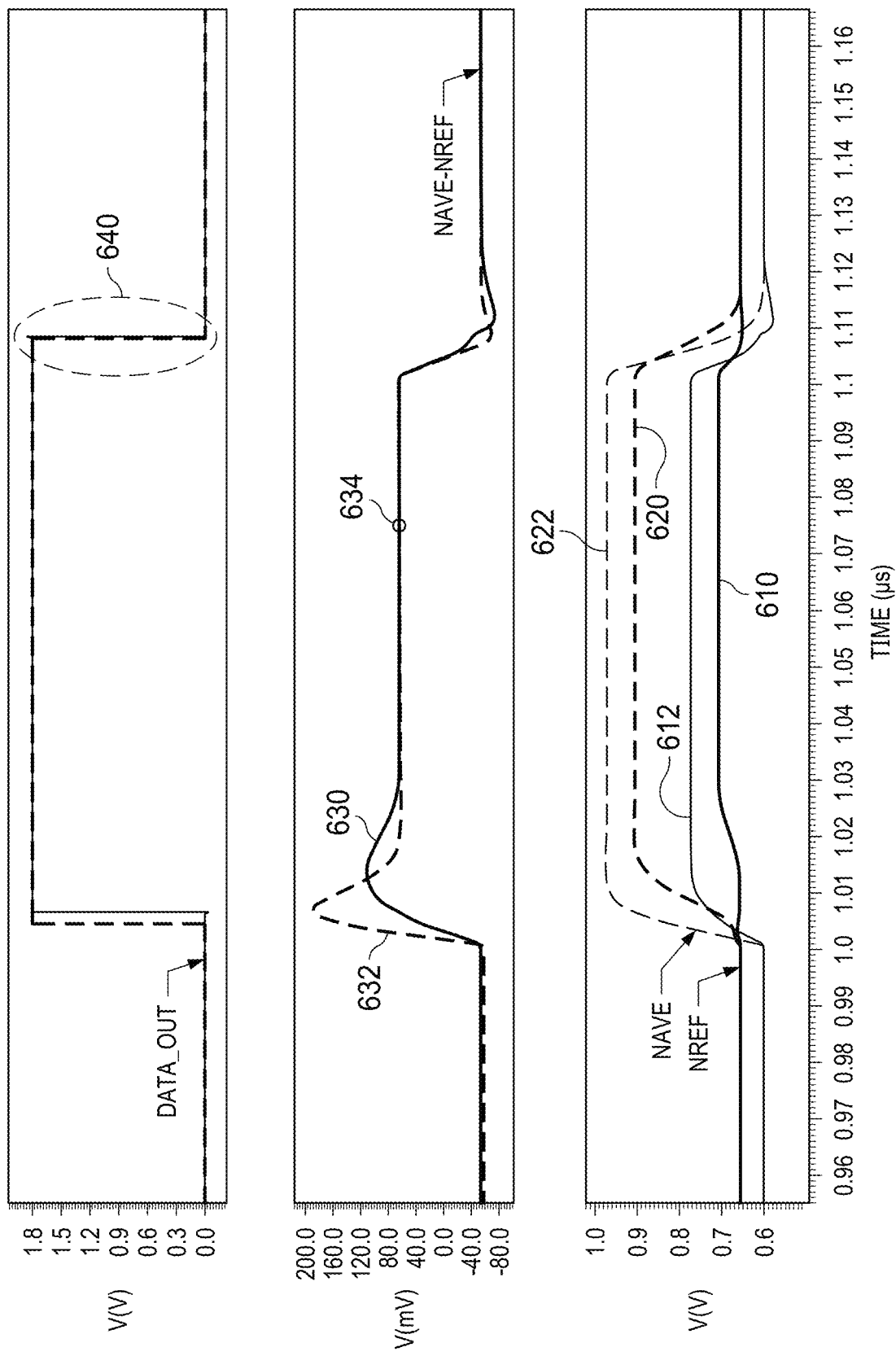
FIG. 6 are waveforms illustrating the operation of the envelope detector of FIG. 5.

FIG. 6 includes waveforms illustrating the operation of the envelope detector 560 with the clamp circuit 580. FIG. 6 shows example waveforms for NREF and NAVE at the bottom of the figure, (NAVE-NREF) in the middle of the figure, and DATA_OUT at the top of the figure. Two waveforms 610 and 620 are shown for NREF, and two waveforms 612 and 622 are shown for NAVE. The variation between NAVE waveforms 612 and 622 may result from process and/or temperature variations. The clamp circuit 580 compensates for such variations by forcing NREF to a larger voltage level (waveform 620) when NAVE is at a larger voltage level (waveform 622). In response to the magnitude of NAVE for waveform 612, the clamp circuit 580 also has forced NREF to a higher value (waveform 610), but lower than for waveform 620. Waveform 632 is NAVE waveform 622 minus NREF waveform 620. Waveform 630 is NAVE waveform 612 minus NREF waveform 610. Despite a larger initial overshoot for the larger voltage level of NAVE waveform 622 relative to NAVE waveform 612 (due to the finite bandwidth of the clamp circuit 580), both waveforms 632 and 630 settle to approximately the same value as identified at 634. Accordingly, the difference (NAVE-NREF) is clamped to the same level 634 despite variations in the level of NAVE with respect to ground. By clamping the difference (NAVE−NREF), much less variation results in the falling edge 640 of DATA_OUT.

Figure 7:
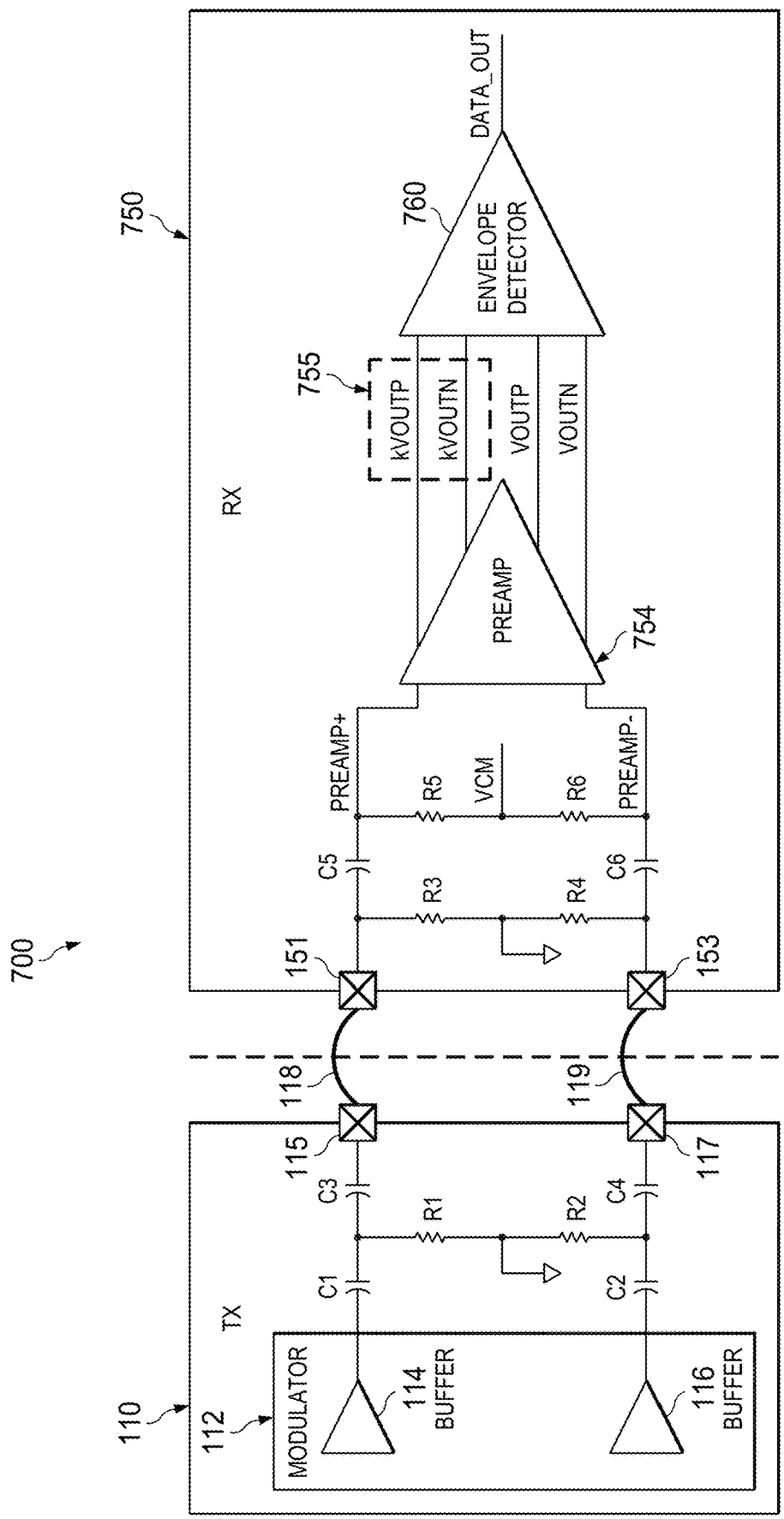
FIG. 7 is a schematic diagram of a system including an envelope detector and a preamplifier with a common mode output, in another embodiment.

FIG. 7 is a schematic diagram of a system 700 generally identical to FIG. 1 with one exception. For system 100 in FIG. 1, the preamplifier 154 provides a single VCM output to the envelope detector 160. However, in FIG. 7 the receiver 750 includes a preamplifier 754 that provides a common mode voltage 755 represented by signals kVOUTP and kVOUTn to an envelope detector 760.

Figure 8:
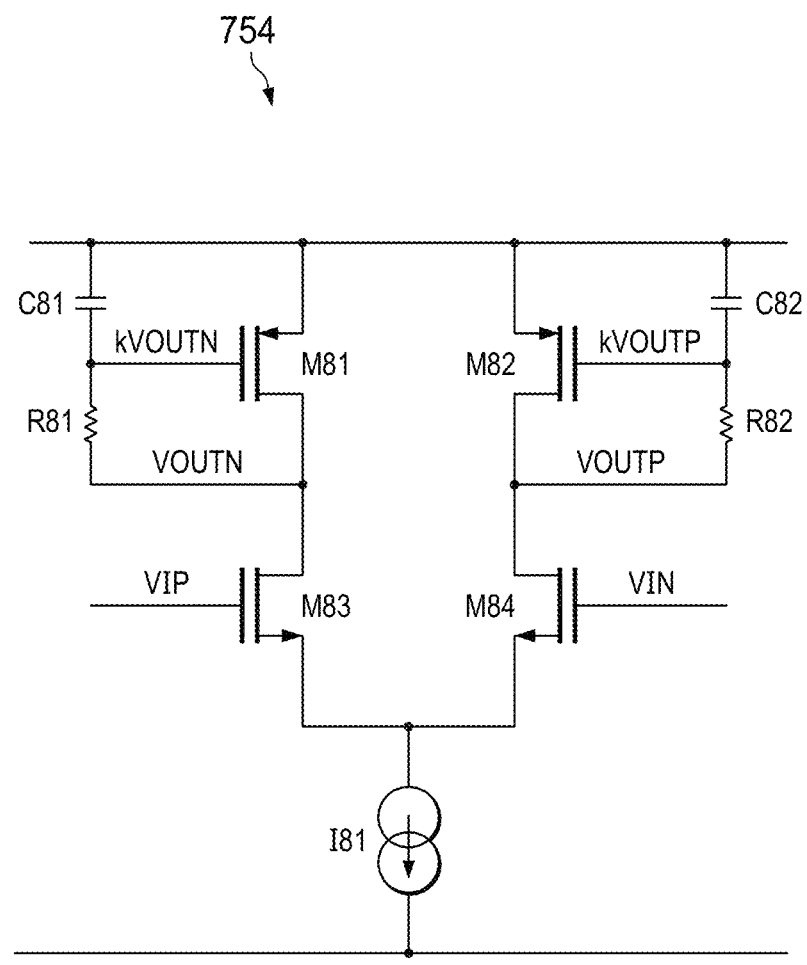
FIG. 8 is a schematic diagram of the preamplifier of FIG. 7, in an embodiment.

FIG. 8 shows an example implementation for preamplifier 754. The preamplifier in this example includes transistors M81-M84, capacitors C81 and C82, resistors R81 and R82, and a current source circuit 181. Transistors M81 and M82 are p-channel field effect transistors (PFETs), and transistors M83 and M84 are NFETs. Capacitor C81 is coupled between VDD and the gate of transistor M81. Resistor R81 is coupled between the gate and drain of transistor M81. Capacitor C82 is coupled between VDD and the gate of transistor M82. Resistor R82 is coupled between the gate and drain of transistor M82. The sources of transistors M81 and M82 are coupled together and to VDD. The drains of transistors M81 and M83 are coupled together. The drains of transistors M82 and M84 are coupled together. Current source circuit 181 is coupled to the sources of transistors M82 and M84 and provides the bias current through the circuit. VIP is coupled to the gate of transistor M83, and VIN is coupled to the gate of transistor M84. The voltage on the drain of transistor M83 is VOUTN, and the voltage on the drain of transistor M84 is VOUTP. The voltage on the gate of transistor M81 is kVOUTN, and the voltage on the gate of transistor M82 is kVOUTP.

The preamplifier 754 receives input voltages VIP and VIN and implements a gain to generate larger output signals VOUTP and VOUTN. Transistors M83 and M84 function as a differential pair and reject the common mode of the input. The preamplifier is configured with a band pass frequency response where the DC gain of the amplifier is $GM_{M83}/GM_{M81}$. The relative size of each Gm is similar and thus the DC gain is low and approximately equal to 1. As a result, signals with frequencies less than the carrier frequency of the modulator are not amplified. The product of the capacitance (C81, C82) and the resistance (R81, R82) is sized such that the high pass filter zero is activated just below the carrier frequency and the gain will be applied to the signal of interest. In this implementation the resistance of R81 and R82 is substantially smaller than $1/g_{ds}$ of either transistor M81 or M82 so the small signal output impedance at node VOUTP is mostly determined by the resistance of R81, R82. Thus, the preamplifier gain is proportional to $GM_{M83}*R$ (R is the resistance of R81, R82). Without any input signal, little or no current flows through the resistors and VOUTP=kVOUTP even when considering device mismatch. However, when considering device mismatch, there will be a difference in VOUTP-VOUTN that is equal to the difference in the gate-to-source voltage (Vgs) of M82 and the Vgs of M81. When the input signal is applied at the carrier frequency (e.g., above the RC time constant in the preamplifier), a gain is applied and VOUTP and VOUTN will be an amplified representation of the input. Because the input signal's frequency is higher than the RC time constant, kVOUTP and kVOUTN appear to be relatively constant and close to their DC operating point. The voltage kVOUTP can be thought of as a low pass filter version of VOUTP. Because the RC time constant is set below the input frequency, most of the output signal is attenuated. Hence, kVOUTP and kVOUTN act as a common mode representation of VOUTP and VOUTN.

Figure 9:
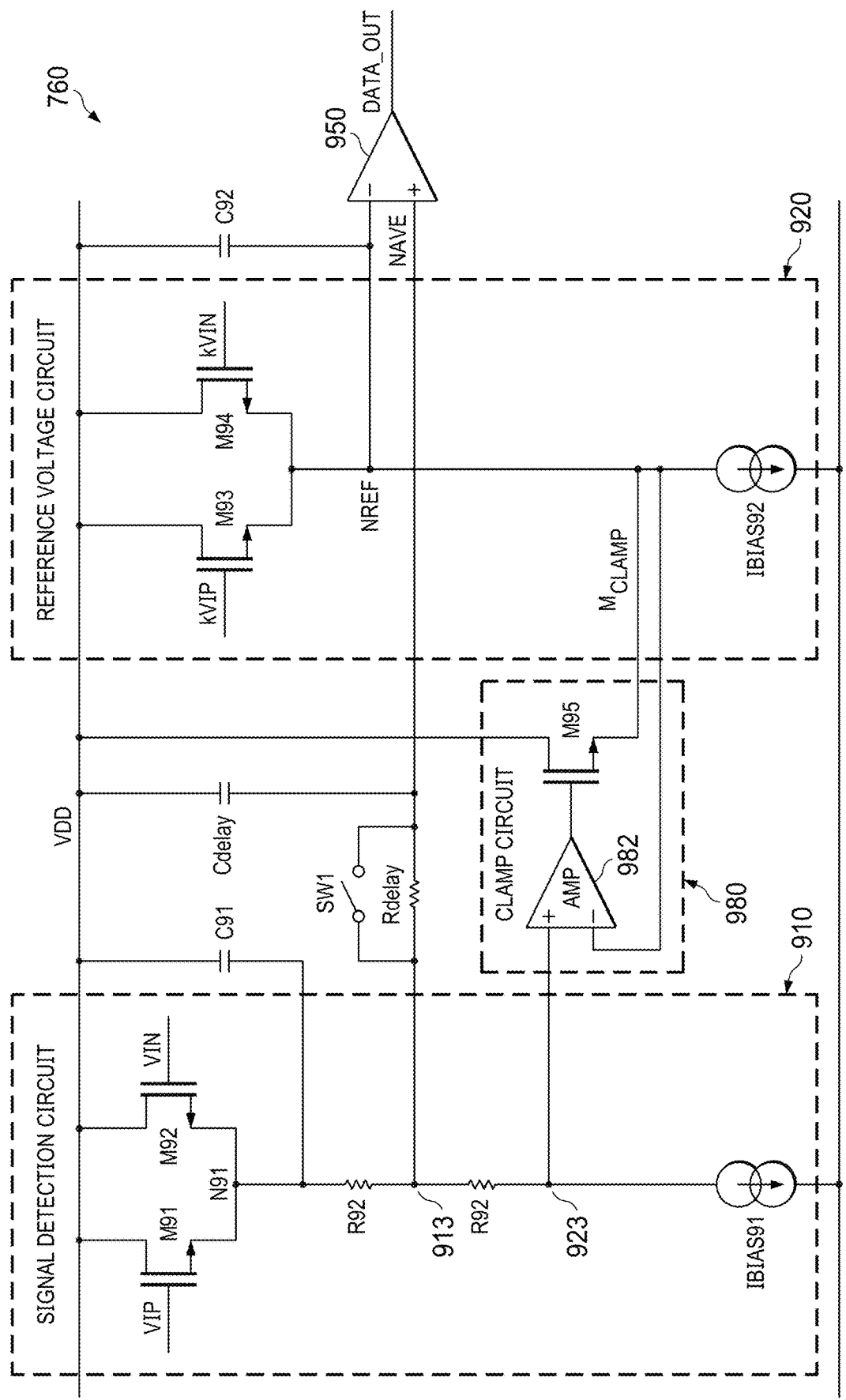
FIG. 9 is a schematic diagram of the envelope detector of FIG. 7, in another embodiment.

FIG. 9 is a schematic of an example implementation of the envelope detector 760 of FIG. 7. Envelope detector 760 is largely the same as envelope detector 560 but includes a different reference voltage circuit than envelope detector 560. Envelope detector 760 includes a signal detection circuit 910, a reference voltage circuit 920, a comparator 950, and a clamp circuit 980.

The signal detection circuit 910 includes transistors M91 and M92, resistors R91 and R92, a capacitor C91, and a current source circuit IBIAS91. Current source circuit IBIAS91 is coupled between resistor R92 and ground. In this example, transistors M91 and M92 are NFETs. The drains of transistors M91 and M92 are coupled together and to the supply voltage VDD. The gates of transistor M91 and M92 provide a differential input for the envelope detector 960. The sources of transistors M91 and M92 are coupled together at node N91. Resistors R91 and R92 are coupled in series, and the series combination of resistors R91 and R92 is coupled between node N91 and the current source circuit IBIAS91. The connection between resistor R92 and the current source circuit IBIAS91 is labeled 923. Capacitor C91 is coupled between VDD and node N91. The signal detection circuit 910 has an output 913 that is the connection between resistors R91 and R92.

The reference voltage circuit 920 includes transistors M93 and M94 (both NFETs in this example) coupled to a current source circuit IBIAS92. The sources of transistor M93 and M94 are coupled together and to the current source circuit IBIAS92 at the output (NREF) of the reference voltage circuit. The inputs to the reference voltage circuit 920 are the gates of transistors M93 and M94 and receive the common mode voltage kVOUTP and kVOUTN, respectively, from the preamplifier 754. The negative input of the comparator 950 receives the reference signal NREF. The positive input of the comparator is coupled through resistor Rdelay to the output 913 of the signal detection circuit 910. Switch SW1 is coupled in parallel with resistor Rdelay. Capacitor Cdelay is coupled between VDD and the positive input of the comparator 950. The comparator's output provides the envelope detector's output signal, DATA_OUT.

The clamp circuit 980 includes an amplifier 982 and a transistor M95. Transistor M95 is an NFET in this example. The amplifier's positive input is coupled to connection 923 within the signal detection circuit 910. The amplifier's negative input is coupled to NREF. The output of amplifier 982 is coupled to the gate of transistor M95. Transistor M95 is coupled between VDD and the output NREF of the reference voltage circuit 920.

The reference voltage NREF is relatively constant in this example. The envelope detector 760, and the clamp circuit 980 in particular, operates largely the same as for the envelope detector 560 and clamp circuit 580 in FIG. 5, and the description of that operation is not repeated here.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead with little or no change to the remaining circuitry. For example, a field effect transistor ("FET") (such as an n-channel FET (NFET) or a p-channel FET (PFET)), a bipolar junction transistor (BJT—e.g., NPN transistor or PNP transistor), an insulated gate bipolar transistor (IGBT), and/or a junction field effect transistor (JFET) may be used in place of or in conjunction with the devices described herein. The transistors may be depletion mode devices, drain-extended devices, enhancement mode devices, natural transistors or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control input and its current terminals. In the context of a FET, the control input is the gate, and the current terminals are the drain and source. In the context of a BJT, the control input is the base, and the current terminals are the collector and emitter.

References herein to a FET being "ON" means that the conduction channel of the FET is present and drain current may flow through the FET. References herein to a FET being "OFF" means that the conduction channel is not present so drain current does not flow through the FET. An "OFF" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described embodiments, and other embodiments are possible, within the scope of the claims.

What is claimed is:

1. A system comprising:
   a transmitter; and
   a receiver coupled to the transmitter, the receiver including:
      a preamplifier; and
      an envelope detector coupled to the preamplifier, wherein the envelope detector includes:
         a signal detection circuit;
         a clamp circuit coupled to the signal detection circuit;
         a reference voltage circuit coupled to the clamp circuit; and
         a comparator including a first input coupled to the reference voltage circuit, and a second input coupled to the signal detection circuit.

2. The system of claim 1, further comprising:
   a resistor coupled between an output of the signal detection circuit and the clamp circuit.

3. The system of claim 1, wherein:
   the clamp circuit includes an amplifier and a transistor including a control terminal, a first current terminal, and a second current terminal.

4. The system of claim 3, wherein:
   an output of the amplifier is coupled to the control terminal of the transistor; and
   the second current terminal of the transistor is coupled to the reference voltage circuit.

5. The system of claim 3, wherein:
   a first input of the amplifier is coupled to the signal detection circuit.

6. The system of claim 3, wherein:
a second input of the amplifier is coupled to the reference voltage circuit.

7. The system of claim 1, wherein:
the signal detection circuit includes a differential input.

8. The system of claim 1, wherein:
the reference voltage circuit includes a differential reference circuit.

9. The system of claim 1, wherein:
the transmitter and the receiver are coupled by bond wires.

10. The system of claim 1, wherein:
the preamplifier outputs a common mode voltage.

11. A device comprising:
a signal detection circuit including a signal detection circuit input and a signal detection circuit output, the signal detection circuit configured to produce a signal at the signal detection circuit output responsive to a first signal at the signal detection circuit input;
a reference voltage circuit including a reference voltage circuit input and a reference voltage circuit output, the reference voltage circuit configured to produce a reference signal at the reference voltage circuit output responsive to a second signal at the reference voltage circuit input; and
a clamp circuit having a clamp circuit input and a clamp circuit output, the clamp circuit input coupled to the signal detection circuit, the clamp circuit input configured to receive a third signal, the clamp circuit output coupled to the reference voltage circuit output, and the clamp circuit configured to limit the reference signal to a clamp voltage of the clamp circuit.

12. The device of claim 11, further comprising:
a comparator having a first comparator input and a second comparator input, the first comparator input coupled to the reference voltage circuit output, and the second comparator input coupled to the signal detection circuit output.

13. The device of claim 11, wherein:
the clamp circuit includes a transistor having a transistor control input and a current terminal; and
an amplifier having a first amplifier input, a second amplifier input, and an amplifier output, the second amplifier input coupled to the reference voltage circuit output, and the amplifier output coupled to the transistor control input.

14. The device of claim 11, wherein:
the signal detection circuit includes a first resistor.

15. The device of claim 14, wherein:
the signal detection circuit includes a second resistor coupled in series with the first resistor.

16. An integrated circuit (IC) comprising:
a preamplifier; and
an envelope detector coupled to the preamplifier, wherein the envelope detector includes:
a signal detection circuit;
a clamp circuit coupled to the signal detection circuit;
a reference voltage circuit coupled to the clamp circuit; and
a comparator including a first input coupled to the reference voltage circuit, and a second input coupled to the signal detection circuit.

17. The IC of claim 16, wherein:
the signal detection circuit includes a differential input circuit.

18. The IC of claim 16, wherein:
the reference voltage circuit includes a differential reference circuit.

19. The IC of claim 16, wherein:
the clamp circuit includes an amplifier and a transistor including a control terminal, a first current terminal, and a second current terminal.

20. The IC of claim 19, wherein:
an output of the amplifier is coupled to the control terminal of the transistor;
the second current terminal of the transistor is coupled to the reference voltage circuit;
a first input of the amplifier is coupled to the signal detection circuit; and
a second input of the amplifier is coupled to the reference voltage circuit.

* * * * *